United States Patent [19]

Hamaguchi et al.

[11] Patent Number: 4,903,242
[45] Date of Patent: Feb. 20, 1990

[54] SERIAL ACCESS MEMORY CIRCUIT WITH IMPROVED SERIAL ADDRESSING CIRCUIT COMPOSED OF A SHIFT REGISTER

[75] Inventors: Kunihiko Hamaguchi; Yasuhide Ohara, both of Toyko, Japan

[73] Assignee: NEC Corporation, Tokyo, Japan

[21] Appl. No.: 190,969

[22] Filed: May 6, 1988

[30] Foreign Application Priority Data

May 6, 1987 [JP] Japan .................... 62-111251
May 6, 1987 [JP] Japan .................... 62-111252

[51] Int. Cl.⁴ .................... G11C 13/00; G11C 7/00
[52] U.S. Cl. .................... 365/230.08; 365/78; 365/189.12; 377/73
[58] Field of Search .................... 377/75, 76, 114, 73; 365/78, 221, 240, 230, 189.12, 230.09, 230.08

[56] References Cited

U.S. PATENT DOCUMENTS

| 3,665,496 | 5/1972 | Donjon | 377/76 |
| 3,906,195 | 9/1975 | Maejimra | 377/73 |
| 4,396,829 | 8/1983 | Sugihava et al. | 377/73 |
| 4,641,278 | 2/1987 | Saito | 365/78 X |

FOREIGN PATENT DOCUMENTS

| 57-37934 | 3/1982 | Japan | 377/73 |
| 58-196688 | 11/1983 | Japan | 365/78 |
| 61-59695 | 3/1986 | Japan | 365/78 |
| 62-95799 | 5/1987 | Japan | 365/78 |

Primary Examiner—Stuart N. Hecker
Assistant Examiner—Alfonso Garcia
Attorney, Agent, or Firm—Sughrue, Mion, Zinn, Macpeak and Seas

[57] ABSTRACT

A serial access memory circuit provided with an improved serial addressing circuit which can be fabricated with a reduced number of elements, is disclosed. The memory circuit comprises a memory array of N columns to be serially accessed, and a serial selection circuit including a shift register of N/K stages, a control circuit generating K output signals and a gate circuit receiving output signals of N/K stages of the shift register and K output signals of the control circuit and generating N output signals.

5 Claims, 3 Drawing Sheets

SERIAL ACCESS MEMORY CIRCUIT WITH IMPROVED SERIAL ADDRESSING CIRCUIT COMPOSED OF A SHIFT REGISTER

BACKGROUND OF THE INVENTION

The present invention relates to a memory circuit, and more particularly to a memory circuit having a function of serially reading from or writing to a plurality of memory cells.

A memory circuit called a serial memory comprises a memory cell array having a plurality of memory cells arranged in a matrix form of rows and columns and a shift register which serially addresses a plurality of memory cells in the designated row at a high speed. In a serial memory utilized in video field, information obtained by serially reading memory cells in each row are used for the display in one line on a screen of a CRT, or other display means. In the typical structure of the serial memory which employs a memory array of M rows and N columns, a row decoder selects one of M rows and data of the N memory cells in the selected row are sequentially read out or written through N columns by serially selecting the N columns by a shift register of N stages. In the shift register, "1" level output is shifted from the initial stage of the N stages towards the last, Nth stage one by one in synchronism with shift clocks.

In the above-mentioned serial memory, the shift register is required to have N stages for selection of N columns of memory cells. In general, each stage of the shift register includes at least six transistors, and therefore, the number of transistors in total required for the shift register of N stages is very large. Therefore, it is difficult to fabricate the shift register on a small space of the semiconductor chip. Particularly, it is difficult to arrange each stage of the shift register with a pitch of the columns of the memory array. Thus, the shift register is an obstacle for a high density serial memory.

Moreover, in case where the number of N is large or the stages of the shift register is large, the length of feed-back path from the last stage to the initial stage becomes large and therefore a large capacitance is inevitably associated therewith. Thus, there is a possibility that the last stage and the initial stage are both selected, resulting in mulfunction.

SUMMARY OF THE INVENTION

It is an object of the present invention to provide a memory circuit provided with an improved serially addressing scheme which can be fabricated with a reduced number of elements.

The memory circuit according to the present invention comprises a memory array of M rows and N columns, M and N being positive integers, a row selection circuit for selecting one of the rows and a column selection circuit for serially selecting the columns one by one, and is featured in that the column selection circuit includes a shift register of N/K stages, K being a positive integer of two or more but less than N, a control circuit having K outputs, and a gate circuit receiving the K outputs of the control circuit and the N/K outputs of the shift register and generating N outputs one by one, the outputs of the gate circuit being used to designate the columns of the array, the control circuit generating one of the K output signals and changing the output from one to another when the N/K stages of the shift register all generate outputs.

According to the present invention, in place of N stages in the conventional shift register, N/K stages can perform the serial selection of N columns. Therefore, the total number of stages or elements required for the N columns can be remarkably reduced.

DETAILED DESCRIPTION OF THE INVENTION

Figure 1:
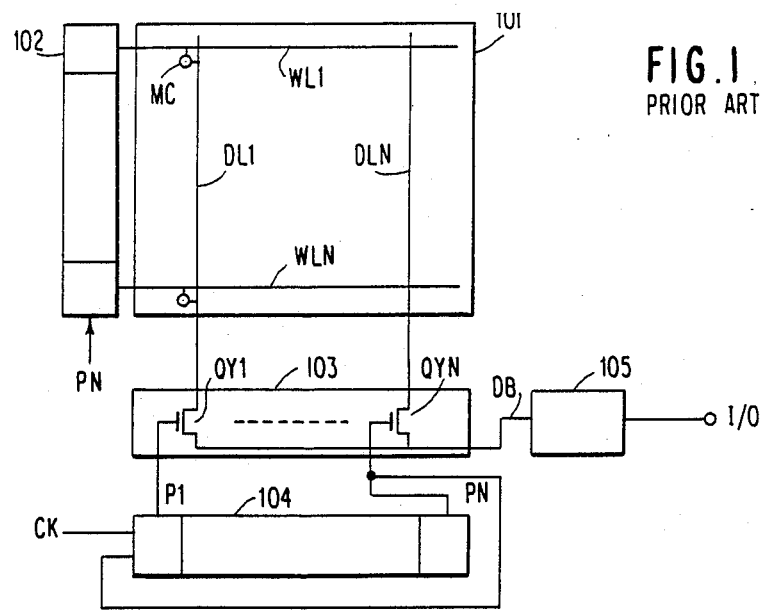
FIG. 1 is a schematic block diagram showing a memory circuit according to a prior art.

Referring to FIG. 1, a memory circuit according to a prior art will be explained.

A memory cell array 101 includes memory cells MC arranged in M rows and N columns. The memory cells MC are connected to word lines $WL_1$-$WL_M$ arranged in rows and digit lines $DL_1$-$DL_N$ arranged in columns in a known manner. The word lines $WL_1$-$WL_M$ are coupled to a row selection circuit 102 and one of the word lines is selected by the row selection circuit 102. A column switch circuit 103 includes a plurality of transfer gate field effect transistors $QY_1$-$QY_N$ coupled between the digit lines $DL_1$-$DL_N$ and a data bus line DB which is connected to an input/output circuit 105 having an input/output terminal I/O. The N transfer gate field effect transistors $QY_1$-$QY_N$ are controlled by N outputs $P_1$-$P_N$ of a shift register 104 of N stages. The shift register 104 shifts only one "1" selective level from the initial stage output $P_1$ towards the last, Nth stage output $P_N$ in synchronism with a chain of clock pulses CK. The Nth output $P_N$ is fed-back to the initial stage of the shift register 104 and also applied to the row selection circuit 102 to shift the location of the selection word line by one in case where the selection circuit 102 is made of a shift register. The selection circuit 102 may be a known random decoder receiving row address signals. In operation, the output $P_1$ is first made active with other outputs at the non-selective level so that a data signal on the digit line $DL_1$ is transferred to the input/output circuit 105 via the enabled transfer gate transistor $QY_1$ and the data bus DB. Then, upon receipt of the clock pulse CK, the selective level is shifted from $P_1$ to $P_2$ so that a data signal on the digit line $DL_2$ is read out via $QY_2$ - DB - the circuit 105. Similarly, by shifting the selective level from $P_2$ to $P_N$ one by one, data signals on the digit lines $DL_3$-$DL_N$ are sequentially read out in synchronism with the clock pulses CK.

However, in the memory of FIG. 1, the shift register 104 is required to have the same number of shift stages as that of the columns and in the simplest case each stage of the shift register 104 is composed of six transistors. To the contrary, in case of dynamic type memory cells, each cell is composed of one transistor and one capacitor and a pitch of the digit lines is very small. Therefore, it is difficult to arrange shift stage of the shift register with the each digit line pitch. Moreover, the number of elements in total required for the shift register is very large. Therefore, it has been difficult to fabricate the shift register on a small area of the chip.

Figure 2:
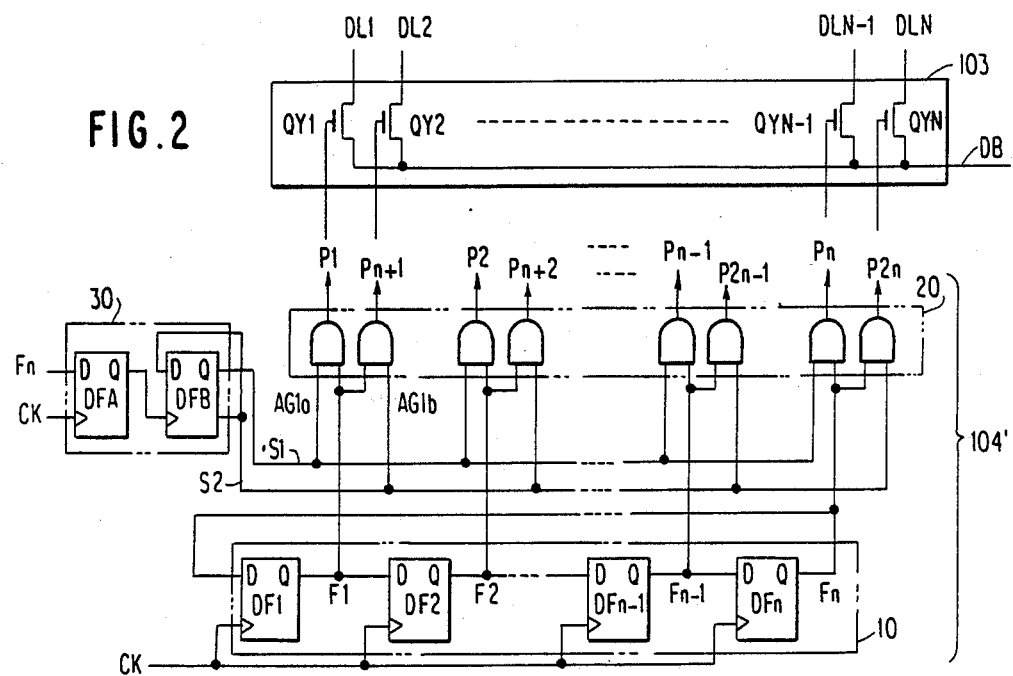
FIG. 2 is a schematic circuit diagram showing a major part of the memory circuit according to a first embodiment of the present invention.

Moreover, the last stage output $P_N$ is fed-back to the initial stage via a relatively long wiring, and therefore, a delay is inevitably introduced into the feed back. With reference to FIG. 2, a major part of the memory circuit according to first embodiment will be explained.

The present embodiment employs a serial selection circuit 104' in place of the shift register 104 and the remaining parts are the same as the conventional ones. Therefore, explanation will be made one the circuit 104' only.

The selection circuit 104' includes a shift register 10 of N/2 stages (K=2 in this case). The number of the stages of the shift register 10 is a half of the N digit lines or of the N transfer gates in the circuit 103. The shift register 10 includes N/2 D-type flip-flops $DF_1$-$DF_n$ connected in cascade and N/2 shift outputs $F_1$-$F_n$ (n=N/2) are derived therefrom. A control circuit 30 has 2 outputs (K=2) $S_1$ and $S_2$ and, in this embodiment, is basically a two-stage shift register composed of D-type flip-flops $DF_A$ and $DF_B$. A clock pulse CK is applied to clock input terminals of the flip-flops $DF_1$-$DF_n$ and DFA. The flip-flop DFA receives the last shift output Fn of the shift register 10 at its data input terminal D and the output of DFA is applied to a clock input of DFB. True and complementary outputs Q and $\overline{Q}$ of DFB are derived as output $S_1$ and $S_2$. The control output signals $S_1$ and $S_2$ are alternately made active in response to activation of Fn.

A gate circuit 20 receives N/2 outputs $F_1$ to $F_n$ of the shift register 10 and two outputs $S_1$ and $S_2$ of the control circuit 30 and has N outputs $P_1$, $P_2$, ... $P_n$, $P_{n+1}$, $P_{n+2}$, ... $P_{2n}$ which are respectively connected to the gates of the transfer gate transistors $QY_1$, ..., $QY_{N-1}$, $QY_2$, ..., $QY_N$. The gate circuit 20 includes N AND-gates having two inputs and one output. The N AND-gates are grouped into N/2 pairs of AND-gates $AG_{1a}$ and $AG_{1b}$ receiving in common one of the N/2 outputs $F_1$, $F_2$ ... $F_n$ of the shift register 10. One of each AND-gate pair (AG 1a) receives one of the control signals ($S_1$), the other $AG_{1b}$ receiving the other control signal $S_2$. Thus, an AND-gate $AG_{1a}$ receives $F_1$ and $S_1$ and an AND-gate $AG_{1b}$ receives $F_1$ and $S_2$. The gate pair $AG_{1a}$ and $AG_{1b}$ sends the shift register output $F_1$ to the output $P_1$ when the control signal $S_1$ is active and to the output $P_{n+1}$ when the control signal $S_2$ is active.

Operations of the circuit of FIG. 2 will be next explained.

In the initial state, $F_1$ among the N/2 outputs $F_1$-$F_n$ of the shift register 10 is at the selective level ("1" level) and the control signal $S_1$ is active, or at the selective ("1") level. The gate circuit 20 outputs $P_1$ via the AND gate $AG_{1a}$. Thus, the signal on the digit line $DL_1$ is transmitted to the data bus line DB through the transfer gate $QY_1$.

Then, upon the application of the clock pulse CK the selective level of the shift register 10 is shifted to the second output $F_2$ from $F_1$. Thus, the output $P_1$ becomes the non-selective level and the output $P_2$ becomes the selective level so that a data signal on the digit line DL 3 is transmitted to the data bus line DB. Similarly, upon the respective applications of the clock pulses CK, the selective level is shifted from $P_2$ toward $P_n$ one by one with the shifted output from $F_2$ toward $F_n$ of the shift register 10. In response to the output $F_n$ and to one pulse of the chain of clock pulses CK, the control circuit 30 changes the selective level from $S_1$ to $S_2$. The shift output of the shift register 10 is also shifted from $F_n$ to $F_1$. Thus, the output $P_{n+1}$ is selected so that the data signal on the digit line $DL_2$ is transmitted to DB via $QY_2$. Then, in response to subsequent applications of CK, $P_{n+2}$, $P_{n+3}$ ... $P_{2n}$ are sequentially selected so that data signals on the even number of digit lines $DL_4$, $DL_6$ ... $DL_N$ are transmitted to DB one by one with the shifted outputs from $F_2$ to $F_n$ of the shift register 10. Then, under the selective level of $F_n$, when the clock pulse CK is applied, the control signal $S_1$ becomes active in place of $S_2$.

As described above, the outputs $P_1$-$P_n$ are sequentially selected.

According to the present embodiment, "N/2+2" stages in total of the register 10 and the control circuit 30 perform N selections in series, and therefore, the number of shift stages can be remarkably reduced.

Moreover, the feed-back path from $F_n$ to $DF_1$ is also made approximately half as compared to the conventional structure of N shift stages.

In the above embodiment, the odd number of digit lines $DL_1$, $DL_3$ ... $DL_{N-1}$ are sequentially selected first, and the even number of digit lines $DL_2$, $DL_4$ ... $DL_N$ are then sequentially selected. However, as far as the order of writing data and the order of reading data is the same, the physical location of the digit lines is not important and not viewed from the outside of the memory.

Figure 3A:
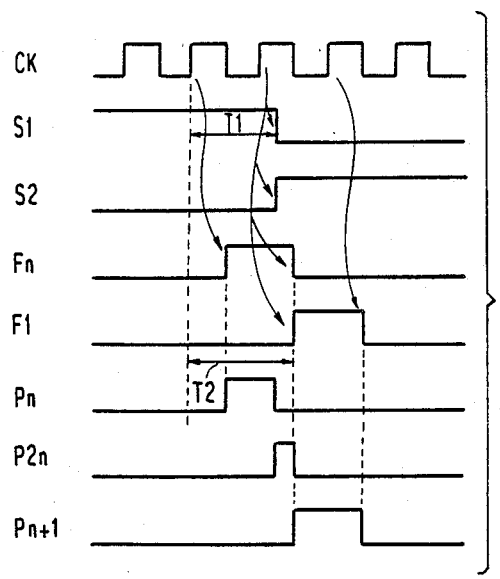
FIGS. 3A and 3B are timing diagrams showing operation of the memory of FIG. 2.
Figure 3B:
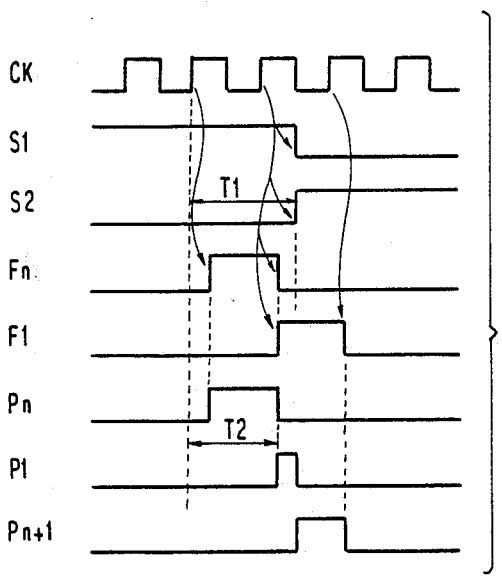

In the embodiment of FIG. 2, the period $T_1$ when the selective level is switched from $S_1$ to $S_2$ or vice versa overlaps with the period $T_2$ when the selective level in the shift register 10 is shifted from $F_n$ to $F_1$, as shown in FIGS. 3A and 3B. FIG. 3A shows the case where $T_1$ is terminated earlier than that of $T_2$ while FIG. 3B shows the case where the termination of $T_2$ is earlier than that of $T_1$. In FIG. 3A, therefore the output $P_{2n}$ may be erroneously selected and the output $P_1$ may be erroneously selected in FIG. 3B.

Figure 4:
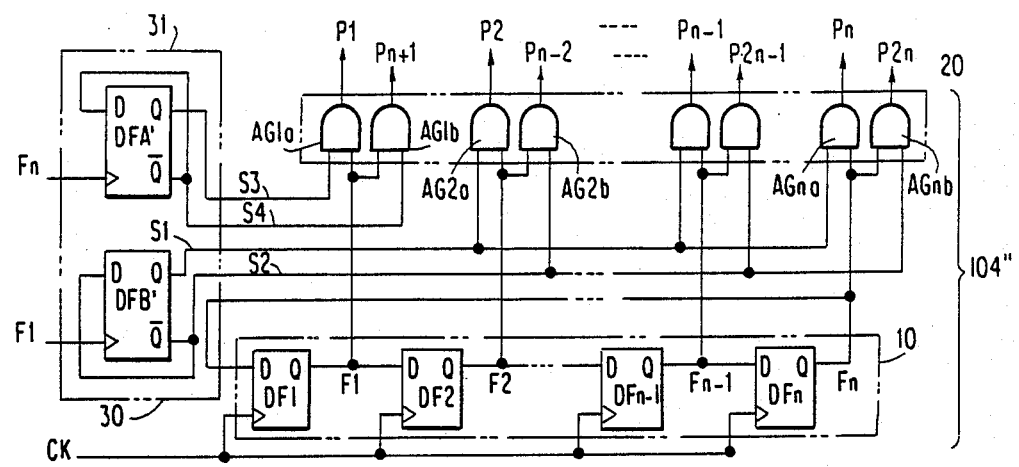
FIG. 4 is a schematic circuit diagram showing a major part of the memory circuit according to a second embodiment of the present invention.

Referring to FIG. 4, a second embodiment of the present invention will be explained.

The serial selection circuit 104" according to the present embodiment employs a control circuit 31 in place of the control circuit 30 of FIG. 2. It also uses the shift register 10 and the gate circuit 20 which are the same as in the first embodiment.

The control circuit 31 includes a D-type flip-flop $DF_B'$ which receives the first stage output $F_1$ in the shift register 10 at its clock input and has a true output Q and a complementary output $\overline{Q}$ fed-back to its data input D, and a D-type flip-flop $DF_A'$ which receives the final stage output $F_n$ at its clock input and has a true output Q and a complementary output $\overline{Q}$ fed-back to its data input D. The outputs Q and $\overline{Q}$ of $DF_B'$ and the outputs Q and $\overline{Q}$ of $DF_A'$ are derived as control signals $S_1$, $S_2$, $S_3$ and $S_4$, respectively. The control signals $S_1$ and $S_2$ are input to the gate pairs ($AG_{2a}$ and $AG_{2b}$, ..., $AG_{na}$ and $AG_{nb}$) receiving the second or more stage outputs $F_2$-$F_n$ in the circuit 20' and the control signals $S_3$ and $S_4$ are applied to only the gate pair ($AG_{1a}$, $AG_{1b}$) receiving the first stage output $F_1$ of the shift register 10, as shown in FIG. 4.

Operation of this embodiment will be explained below. In the initial state, the first stage output $F_1$ and the control signals $S_1$ and $S_3$ are at the selective level so that the selection output $P_1$ is activated. Then, in response to application of the pulse CK, the second stage output $P_2$ is activated so that $P_2$ is made selective. In the similar manner, the outputs $P_3$ to $P_{n-1}$ are sequentially selected one by one in response to the respective application of CK.

Next, under the selection of $P_{n-1}$, upon the receipt of CK, the selective level is shifted from $F_{n-1}$ to $F_n$ in the shift register 10 and the selection output is also shifted from $P_{n-1}$ to $P_n$. In this instance, the control signal $S_4$ becomes active in place of $S_3$. Therefore, the activation of $P_n$ is made independently from the change of $S_3$ and $S_4$ in levels.

Next, when one pulse of CK is received, the selection level of the shift register is shifted from $F_n$ to $F_1$ and the control signal $S_2$ becomes active in place of $S_1$ simultaneously. In this instance, the control signal $S_4$ has been already activated so that the selection output $P_{n+1}$ is immediately activated without being influenced by the change of the control signals $S_1$ and $S_2$ in levels.

Thereafter, each time when the pulse CK is received, the selection output is shifted from $P_{n+1}$ towards $P_{2n}$, one by one.

When the output $P_{2n}$ is to be activated, the control signal $S_3$ becomes active again. But, the above activation of $P_{2n}$ is not affected by the change of $S_3$ and $S_4$.

Figure 5:
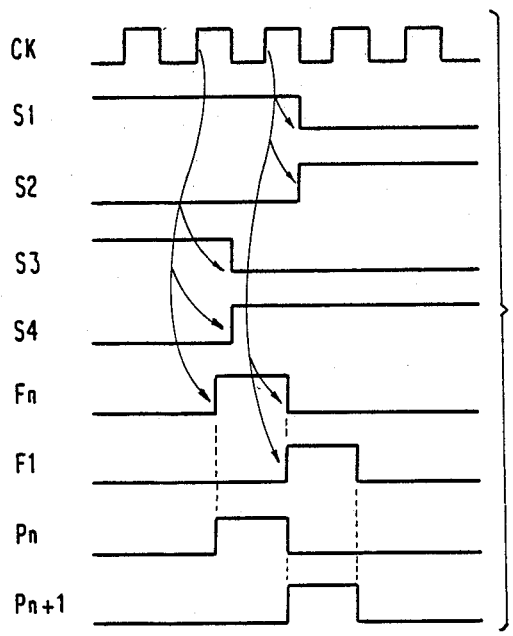
FIG. 5 is a timing diagram showing operation of the second embodiment.

FIG. 5 shows the above operation of the circuit of FIG. 4. According to the present embodiment, there is no possibility of multiselection of the digit lines.

Figure 6:
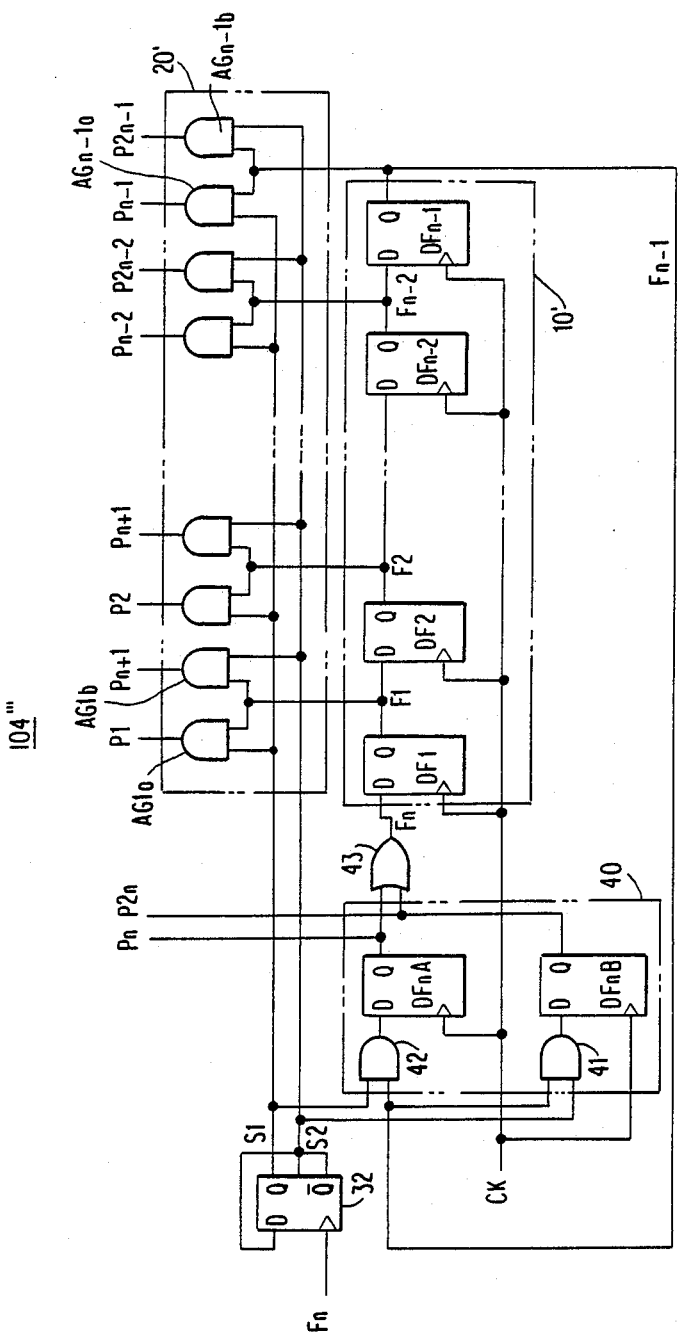
FIG. 6 is a schematic circuit diagram showing a major part of the memory according to a third embodiment of the present invention.

Referring to FIG. 6, the serial selection circuit according to a third embodiment of the present invention will be explained.

The final stage (n-th) 40 of the shift register 10' is comprised of AND gates 41, 42, D-type flip-flops $DF_{nA}$ and $DF_{nB}$ and an OR gate 43. A control circuit 32 for producing the control signals $S_1$ and $S_2$ is made of a D-type flip-flop DFC. The circuit 20' has "N/2-1" gate pairs receiving the shift outputs $F_1$ to $F_{n-1}$.

Operation of this embodiment will be explained below.

Figure 7:
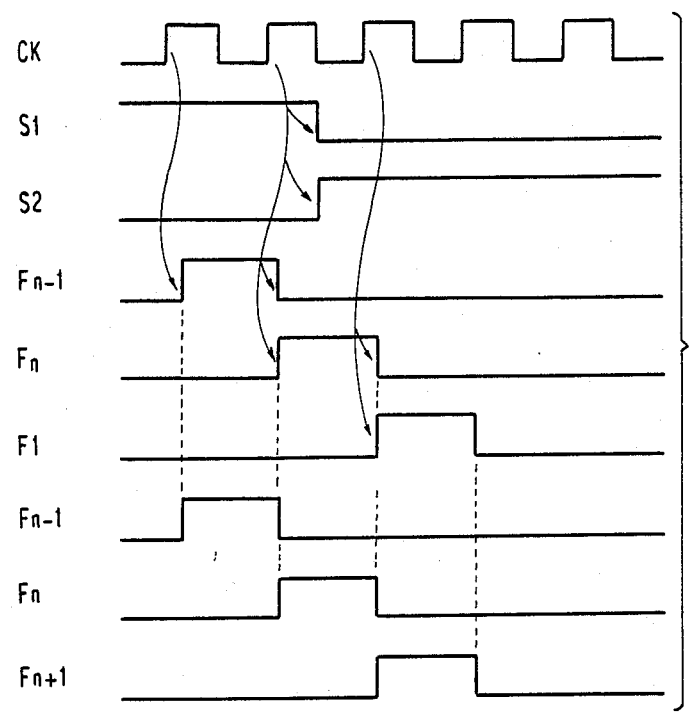
FIG. 7 is a timing diagram showing operation of the third embodiment.

In the initial stage, the first stage output $F_1$ and the control signal $S_1$ are selected and the output $P_1$ is selected. Then, one pulse of CK is received, the second stage output $P_2$ becomes active so that $P_2$ is selected. Similarly, upon each receipt of the pulse of CK, the outputs $P_3$ to $P_{n-1}$ are sequentially activated one by one. Under the activation (selection) of $P_{n-1}$, upon the receipt of one pulse of CK, the AND gate 42 produces "1" output so that the flip-flop $DF_{nA}$ is set. Therefore, the output Q of $DF_{nA}$ is energized and the output $P_n$ is selected. During the period $T_1$ when the output Q of $DF_{nA}$ is selected, the circuit 32 changes the active level from $S_1$ to $S_2$, as shown in FIG. 7. Thus, the activation of $P_n$ is made irrespective of change in the control signals $S_1$ and $S_2$.

Then, when one pulse of CK is received, the the flip-flop $DF_1$ writes the active level of $F_n$ therein so that the $F_1$ is selected and the output $P_{n+1}$ is made selective.

Similarly, the outputs $P_{n+2}$ to $P_{2n-1}$ and $P_{2n}$ are sequentially selected in response to the receipt of the pulses CK, one by one.

As explained above, according to the present invention, N serial addresses can be sequentially selected one by one by use of N/2 stages of a shift register.

I claim:

1. A memory circuit comprising a memory array of memory cells having N addresses, wherein N is a positive integer larger than 3, to be serially selected, and a serial selection circuit for serially selecting said N addresses one by one in synchronism with control pulses, said serial selection circuit including a shift register having N/K, wherein K is a positive integer equal or larger than 2 and less than N, shift outputs, said shift register activating sequentially the N/K shift outputs sequentially one by one in synchronism with said control pulses, a control circuit having K control outputs and activating only one of the K control outputs, said control circuit changing the output from one of said K control outputs to another after said shift register activates all the N/K shift outputs, and a gate circuit coupled to said N/K shift outputs of said shift register and to said K control outputs of said control circuit and generating N selection output signals one by one.

2. The memory circuit according to claim 1, in which said gate circuit includes N/K gate unit circuits, each of said gate unit circuits being coupled to one of said N/K shift outputs and to said K control outputs and having K selection outputs.

3. The memory circuit according to claim 1, in which said shift register includes N/K stages of D-type flip-flop connected in cascade.

4. A memory circuit comprising a memory array having a plurality of memory cells arranged in rows and N columns wherein N is an integer larger than 3, and a serial selection circuit for serially selecting said N columns one column by one column in response to control pulses, said serial selection circuit including a shift register having N/K shift stages, wherein K is an integer equal or larger than 2 and less than N, and generating output signals one stage by one stage in synchronism with said control pulses through said shift stages, a state control circuit having K control outputs, one of said K control outputs being activated and the location of the activated control output being changed when all the N/K shift stages of said shift register have generated output signals a gate circuit having N/K gate units and N output signals, each of said gate units being coupled to said K control outputs and receiving one of said output signals of said N/K shift stages, and a selection circuit responsive to the N outputs signals of said gate circuit for selecting one of said N columns.

5. The memory circuit of claim 4, in which each of N/K gate units of said gate circuit has K AND-gates, each of said K AND-gate having two inputs and one output, one of said two inputs being coupled to one of said K control outputs and the other of said two inputs receiving in common said one of output signals of said N/K shift stages.

* * * * *